INVENTOR.
BRUCE C. MITCHELL
BY [signature]
[signature]
ATTORNEYS

Dec. 9, 1969 B. C. MITCHELL 3,483,475

EXTENDED RANGE LOG AMPLIFIER

Filed Jan. 11, 1966 2 Sheets-Sheet 2

INVENTOR.
BRUCE C. MITCHELL
BY
ATTORNEYS

United States Patent Office 3,483,475
Patented Dec. 9, 1969

3,483,475
EXTENDED RANGE LOG AMPLIFIER

Bruce C. Mitchell, Ellicott City, Md., assignor, by mesne assignments, to the United States of America as represented by the Secretary of the Navy Filed Jan. 11, 1966, Ser. No. 520,310
Int. Cl. G06g 7/24
U.S. Cl. 328—145 4 Claims

ABSTRACT OF THE DISCLOSURE

The logarithmic amplifier circuit includes a plurality of cascaded amplification stages. Each of the amplification stages is operative to change gain from a value greater than unity to a value of unity at a certain predetermined signal amplitude so that the overall circuit comprising the plurality of stages has a transfer function which is defined by substantially linear operation between a plurality of pairs of adjacent points lying on a logarithmic curve. At least one of the amplification stages includes a feedback loop which is adapted to become operative to provide back bias after all the stages have changed to unity gain. The useful dynamic range of the amplifier is accordingly significantly extended without the addition of more feedback loops which have the detraction of adding a higher noise figure. Moreover, the addition of back biasing is accomplished relatively inexpensively.

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

This invention relates to a logarithmic amplifier circuit and more particularly is concerned with a novel logarithmic amplifier circuit which has a significantly extended dynamic range of operation.

The present day applications of logarithmic amplifiers are quite considerable, especially in uses with sonar and radar equipments. A most useful property of logarithmic amplifiers is that of compressing the dynamic range of the input and this characteristic property has very interesting and statistical consequences. In particular, it may be demonstrated that a logarithmic receiver will reduce a non-stationary noise background to a stationary one when given two conditions on the input noise spectrum. A logarithmic receiver is a logarithmic amplifier followed by a device, usually a differentiating circuit, for removing the statistical mean of the logarithmic amplifier output. This statistical property of logarithmic receivers makes possible constant false alarm probability operation of a signal detecting equipment such as sonar or radar.

A mathematically conceivable amplifier may have a logarithmic transfer function expressable as $$E_o = A \times \log E_i$$

where $E_o$ is the output voltage, $E_i$ is input voltage and A is some constant. Such an amplifier is, however, physically unrealizable since $E_o$ approaches infinity as $E_i$ approaches 0. This would necessarily imply that when $E_i=0$ the logarithmic amplifier would draw an infinite amount of energy from any load having an finite impedance. Accordingly, for a logarithmic amplifier that is reliable in practical operation, it must be stipulated that $E_o=0$ when $E_i=0$. This in turn implies that the transfer function of the amplifier becomes $$E_o = A \log (1+E_i)$$

S. J. Solms, in an article appearing in the December 1959 I.R.E. Transactions on Instrumentation, entitled Logarithmic Amplifier Design, suggested one way to synthesize such a function by cascading a number of identical amplifier stages whose gain changes from a value more than unity to unity at a certain signal amplitude. With such an arrangement it may be demonstrated that the operation of the amplifier circuit is linear between a plurality of pairs of adjacent points which lie substantially on a logarithmic curve, thereby closely approximating the operation of a true logarithmic amplifier. Most logarithmic amplifiers presently in use are required to have a transfer function characteristic which lies within close tolerances, usually of the order of ±1 db of a true logarithmic curve. With such a limitation, logarithmic amplifiers designed in the past have been limited in input dynamic range and the lower portion of the range is commonly used for normalizing noise. As a consequence, the remaining portion of the dynamic range may be insufficient for many applications.

The logarithmic amplifier circuit described and disclosed by Solms is limited at the lower input signal level by the self-noise of the amplifier circuit. The addition of more amplification stages to increase the dynamic range also adds more noise and thus negates most of the advantage of increased range. As will be apparent to those skilled in the art, the addition of more amplification stages is also relatively expensive.

It is a primary object of the present invention to overcome the disadvantages of prior art logarithmic amplifier circuits by significantly increasing the operational range of that type amplifier without adding more noise or additional amplification stages to the circuit.

Another object of the present invention is to afford such increased range of operation without affecting the logarithmic characteristic accuracy within desired limitations.

A still further object of the present invention is to affect the aforementioned advantages by a method and means which is inexpensive to implement.

The present invention, in its most fundamental form, may comprise a logarithmic amplifier circuit having a plurality of cascaded amplification stages, each of which amplification stages is operative to change gain from a value greater than unity to unity at a certain signal amplitude, generally in the manner previously described, but including at least one amplification stage which has a feedback loop adapted to become operative after all the stages have changed to unity gain; the entire circuit thus has a transfer function defined by substantially linear operation between a plurality of pairs of adjacent points lying on a logarithmic curve. In accordance with the concept of the present invention, the addition of feedback loops to one or more of certain amplification stages within the logarithmic amplifier circuit extends the operational range of the amplifier by as much as 30% or more. It is to be noted that the present invention does not involve the addition of more amplification stages within the logarithmic amplifier circuit and accordingly no additional noise sources are added to the circuit. Moreover, the additional of a relatively simple feedback loop is inexpensive to implement as contrasted to the addition of more amplification stages or of more complicated circuit arrangements. A further most desirable advantage of the present invention is that the addition of properly designed feedback loops to certain of the amplification stages within the logarithmic amplifier's circuit does not effect the logarithmic characteristic accuracy of the transfer function of the over-all circuit.

These and other objects, features and advantages of the present invention will be better understood from the following description of an embodiment of the present invention together with the drawings illustrating that embodiment and its scope will be more particularly pointed out in the appended claims.

As was previously mentioned, Solms demonstrated that one way to synthesize a logarithmic transfer function is to employ a number of identical amplifier stages in cascaded arrangement, so designed and conceived that the gain of the stages changes from a value greater than unity to unity at a certain input signal amplitude. Thus, for a plurality of cascaded amplification stages, the overall amplifier circuit operates substantially as a linear amplifier within portions of its operational range. Such linear operation, however, is terminated for each stage at a break point which is related to the point of operation where the gain for the amplification stage changes from some value greater than unity to unity as the input signal reaches a certain signal amplitude. Solms demonstrated that for a plurality of cascaded amplification stages each of such described break points lies on a single logarithmic curve. Accordingly, the amplifier circuit operates linearly within predictable regions and is usually referred to as a lin-log amplifier, due to its characteristic linear operation within points lying on a true logarithmic curve.

Since the transfer function curve deviates from a true logarithmic curve at all but the described break points, the operation of the amplifier circuit is not truly and wholly logarithmic but rather logarithmic within an approximation. The error due to such approximation may be mathematically calculated and for typical logarithmic amplifier circuits conceived by the present invention, predictable lin-log operation may be achieved within a maximum error deviation of $\pm 1$ db and over a dynamic range of 80 db. In typical embodiments of the present invention the concept of additional back-biasing feedback loops as applied to the first two amplification stages of a logarithmic amplifier circuit has been found to increase the overall dynamic range of the circuit by as much as 24 db.

Figure 1:
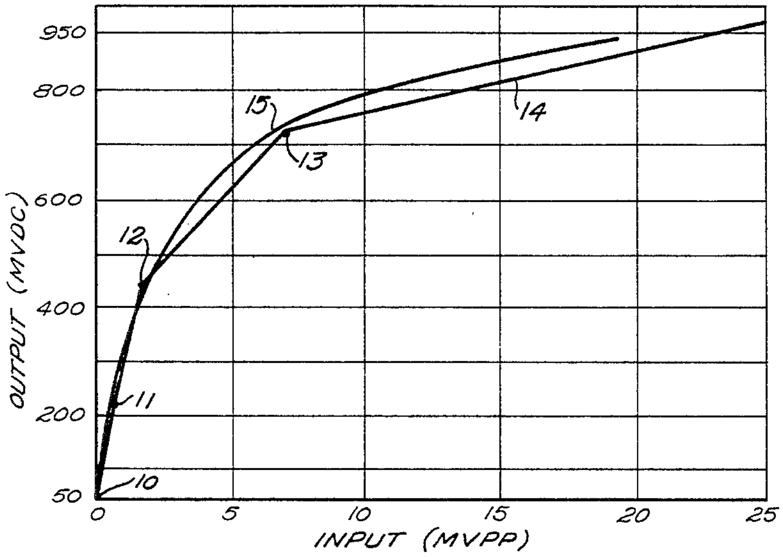
FIG. 1 is a graphic illustration of a lin-log transfer function of a logarithmic amplifier circuit.

FIG. 1 is illustrative of the typical operation of such an extended range logarithmic amplifier circuit, showing the substantially linear operation of amplification stages within the amplifier circuit between break points which lie on a single logarithmic curve. In FIG. 1 the input to the logarithmic amplifier circuit is shown along the abscissa in terms of millivolt, peak-to-peak signal; the output is shown along the ordinate in terms of millivolt DC signal. It will be noted that the logarithmic amplifier circuit has an operative characteristic approximating true logarithmic transfer function and performs in a substantially linear manner between the points 10 and 11 shown in the illustration of FIG. 1; the gain slope of the amplifier circuit then changes at point 11, with substantially linear operation following between the break points defined by the numerical designations 11 and 12. At the break point shown at 12, the gain slope again changes so as to define a new slope of substantially linear operation between break points 12 and 13. Similarly at break point 13, the gain slope of the amplifier circuit again changes, defining a substantially linear region of operation extending from break point 13 through point 14. Thus, the overall operation of the amplifier circuit is one which closely approximates the true logarithmic transfer function as defined by the graphic illustration of the continuous curve designated 15.

Figure 2:
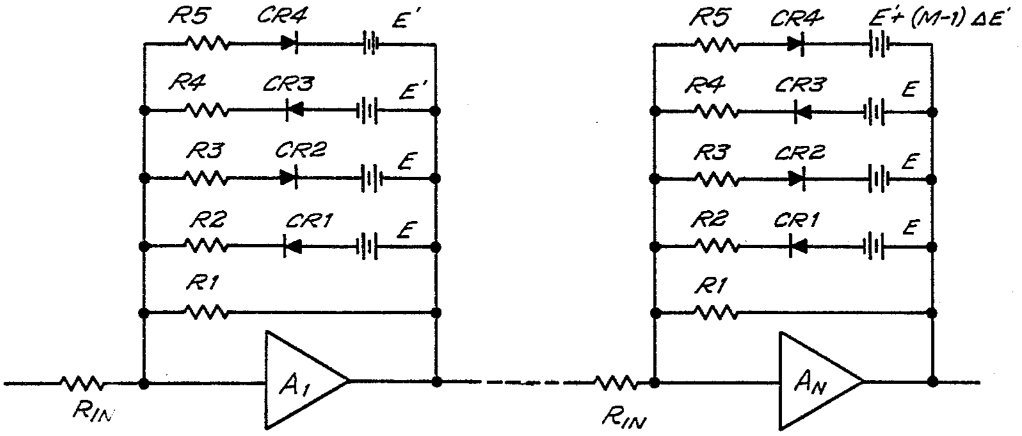
FIG. 2 is a schematic diagram of a logarithmic amplifier circuit of the present invention.

FIG. 2 schematically illustrates an embodiment of the logarithmic amplifier circuit of the present invention. In the logarithmic amplifier circuit of the type described by Solms, and alluded to hereinbefore, a series of $n$ identical amplification stages were employed. Each amplification stage had a feedback loop such as that shown by $R_1$, $R_2$–CR1–E, and $R_3$–CR2–E as shown in FIG. 2. It will be recalled that in accordance with the prior art concept, at the upper end of the operational range of such amplifier circuits all its amplification stages would have an incremental gain of unity. The present invention contemplates the addition of feedback loops which, upon becoming operable, change the incremental gain from unity to $-m$ db, where $m$ is the small signal gain of each amplification stage. The additional feedback loops may comprise $R_4$–CR3–E′ and $R_5$–CR4–E′ as shown in the amplification stages $A_1$ and $A_n$ of FIG. 2. Since all the amplification stages have reached a point of incremental gain of unity before the additional feedback loops operate in accordance with the contemplation of the present invention, the back biasing voltage $nE'$ must be staggered by $\Delta E'$, where $\Delta E' = \log \text{ slope } X m(\text{db})$. E′ is set to be $\Delta E'$ above the peak voltage swing of the last stage when it has reached the maximum limit of its original logarithmic range. For the $n$th amplification stage the additional feedback loops are then back-biased by $E' + (n-)\Delta E'$.

In practice it has been found that the operational limitation for actual embodiments of this concept is the amount of voltage swing which may be taken at the various amplification stages. For example, in a typical embodiment of the present invention in a logarithmic amplifier circuit may readily respond to performance specifications requiring a maximum deviation of $\pm 1$ db from true logarithmic transfer function together with a dynamic range of not less than 80 db. Employing the concept of the present invention by adding additional feedback loops for back-biasing to the first two stages of amplification extended the dynamic range of the overall operation of a typical logarithmic amplifier circuit by 24 db.

Figure 3:
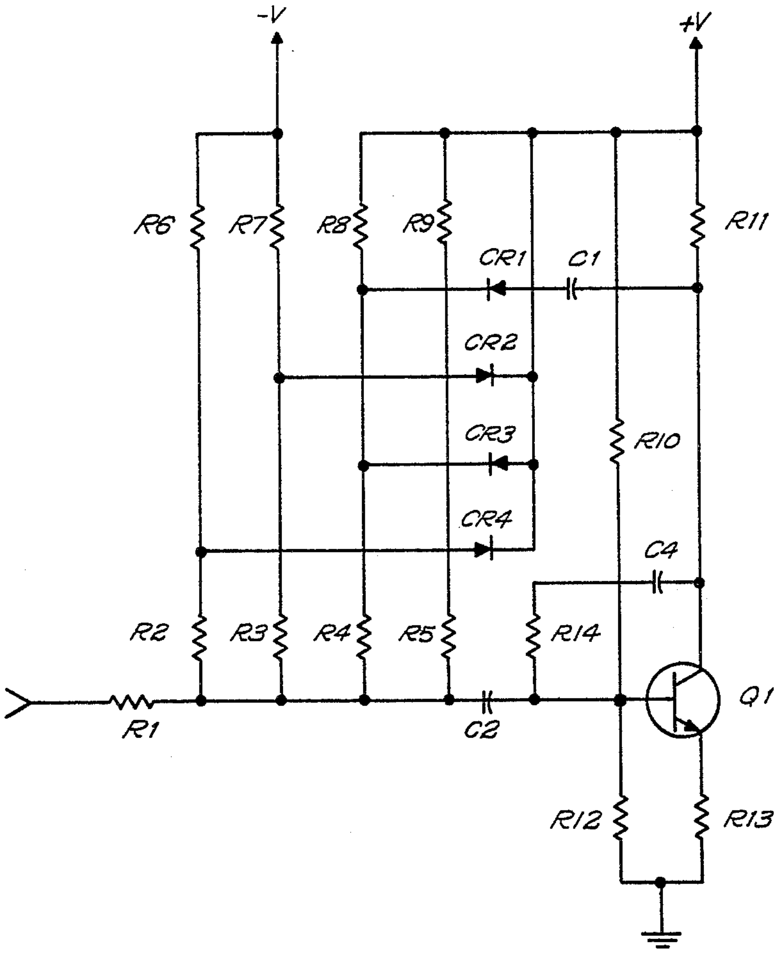
FIG. 3 is a schematic wiring diagram of a typical amplification stage of the type employed in the logarithmic amplifier circuit of the present invention.

FIG. 3 illustrates a schematic wiring diagram of a single amplification stage, a number of which may be included in a logarithmic amplifier circuit embodying the present invention. The amplification stage of FIG. 3 employs a transistor amplification means designated Q1 and connected to an appropriate source of electrical energy through a resistor R11. A plurality of feedback loops are completed between the emitter and the base of Q1 through the capacitors $C_1$, $C_2$ and $C_4$ and unidirectionally conductive means CR1, CR2, CR3, CR4 connected in series with resistances $R_5$, $R_4$, $R_3$ and $R_2$ respectively. Appropriate voltage dropping resistors $R_6$, $R_7$, $R_8$ and $R_9$ are connected to the source of electrical energy to provide the desired voltages.

In accordance with the concept of the present invention, circuit parameters and electrical components are designed, chosen and combined so that where the input signal has reached a certain determinable amplitude, the gain of the amplification stage of FIG. 3 changes from a value greater than unity, to unity; thereafter, as the input signal increases in value, the gain of the amplification stage changes from unity to $-m$ db, where $m$ is the small signal gain of the amplification stage. The latter operative function is effected by additional back-biasing feedback which occurs after the gain of all amplification stages of the logarithmic amplifier have become unity, as contemplated by the concept of the present invention.

As will be appreciated by those skilled in the art, a plurality of such amplification stages as exemplified by the illustration of the wiring diagram of FIG. 3 are employed in a logarithmic amplifier circuit embodying the present invention. Its highly desirable results of significantly extended dynamic range of operation without detrimentally effecting the logarithmic characteristic accuracy is realized within the concept of the present invention without the addition of more noise sources such as would be necessarily involved by the addition of more amplification stages.

Moreover, the present invention is relatively inexpensive to implement inasmuch as it requires the addition of properly designed feedback loops rather than entire additional amplification stages. Thus, it will be appreciated by those skilled in the art that the present invention makes possible highly desirable results in an inexpensive yet effective manner by circumventing and overcoming the disadvantages which are inherent in comparable prior art logarithmic amplifier circuits and more particularly the former practice of employing additional amplification stages which have the disadvantage of adding more sources of noise and negating most of the additional dynamic range which was realized by the addition of such amplification stages.

Obviously many modifications and variations of the present invention are possible in the light of the above teachings. It is therefore to be understood that within the scope of the appended claims the invention may be practiced otherwise than as specifically described.

What is claimed is:

1. A logarithmic amplifier circuit comprising:

a plurality of cascaded amplification stages, each of said amplification stages being operative to change gain from a value greater than unity to unity at a certain signal amplitude, whereby said circuit has a transfer function defined by substantially linear operation between a plurality of pairs of adjacent points lying on a logarithmic curve; and at least one of said amplification stages including a feedback loop adapted to become operative to provide back-bias after all said stages have changed to unity gain.

2. A logarithmic amplifier circuit as defined in claim 1 wherein said amplification stages are identical except for said feedback loop.

3. A logarithmic amplifier circuit as defined in claim 1 wherein said feedback loop is one of several feedback loops.

4. A logarithmic amplifier circuit as defined in claim 1 wherein said feedback loop is operative to change the incremental gain from unity to $-m$ db, where $m$ is the small signal gain of the stage.

References Cited

UNITED STATES PATENTS

| | | | |
|---|---|---|---|
| 3,252,007 | 5/1966 | Saari | 328—145 |
| 3,361,975 | 1/1968 | Rorden | 333—14 |
| 3,374,361 | 3/1968 | Callis | 328—145 |
| 3,375,460 | 3/1968 | Miller | 330—103 |

DONALD D. FORRER, Primary Examiner

HAROLD A. DIXON, Assistant Examiner

U.S. Cl. X.R.

307—229